(12) United States Patent
van der Windt (10) Patent No.: US 6,713,792 B2
(45) Date of Patent: Mar. 30, 2004

(54) INTEGRATED CIRCUIT HEAT SINK DEVICE INCLUDING THROUGH HOLE TO FACILITATE COMMUNICATION

(75) Inventor: Leendert J. van der Windt, Almelo (NL)

(73) Assignee: Anaren Microwave, Inc., East Syracuse, NY (US)

( * ) Notice: Subject to any disclaimer, the term of this patent is extended or adjusted under 35 U.S.C. 154(b) by 56 days.

(21) Appl. No.: 10/060,563

(22) Filed: Jan. 30, 2002

(65) Prior Publication Data

US 2003/0141600 A1 Jul. 31, 2003

(51) Int. Cl.$^7$ ............................................... H01L 23/48
(52) U.S. Cl. ..................... 257/252; 257/712; 257/706; 174/255
(58) Field of Search ............................... 257/706, 712, 257/713; 174/252, 255, 262, 263, 264, 265, 266; 361/717–720, 792, 793, 794, 795

(56) References Cited

U.S. PATENT DOCUMENTS 6,521,844 B1 * 2/2003 Fuerniss et al. ............ 174/258

* cited by examiner

Primary Examiner—Kamand Cuneo
Assistant Examiner—Lourdes Cruz (74) Attorney, Agent, or Firm—Bond, Schoeneck & King, PLLC

(57) ABSTRACT

A method of manufacturing a printed circuit board through-hole connection includes forming a through-hole by removing material from the first side of the printed circuit board until the backing and then slightly into the first side of the backing providing a hole. Next, plating through the hole connecting the backing layer, ground layer, and signal layer. Now the plating of the signal layer is removed without removing the connection from the ground layer to the backing. Finally, the hole is filled from the first side of the printed circuit board.

A method of manufacturing a MMIC printed circuit board through-hole connection includes forming a through-hole by removing material from the first side of the MMIC printed circuit board through the first signal layer, through the MMIC until the second signal layer, and then slightly into the top side of the second signal layer. Once the material is removed, an electrical connection is provided to the first signal layer, the MMIC and the second signal layer.

A printed circuit board through-hole connection that includes an assembled layout of a printed circuit board and formed through holes by material removed from the first side of the printed circuit board up to the backing and then slightly into the top portion of the backing. It further includes plated through-holes that connect the backing, a ground layer and a signal layer, removed plating from the signal layer without the connection removed from the ground layer to the backing and filled through-holes from the first side with a non conductive filler.

20 Claims, 3 Drawing Sheets

| PROCESS# | ROUTE | LAYER |
|---|---|---|
| 6000 | Material | A-bla/AL1 |
| 6900 | Drilling | A-bla/AL1 |
| 7000 | Plasma_Etch | A-bla/AL1 |
| 7075 | Black_Hole | A-bla/AL1 |
| 7150 | Panel_Plating | A-bla/AL1 |
| 6130 | ML lamination | A-bla/AL1 |
| 6200 | ML exposure | A-bla/AL1 |
| 7400 | Control_1 | A-bla/AL1 |
| 7700 | CU etch_1 | A-bla/AL1 |
| 8000 | Multibond | A-bla/AL1 |
| 6000 | Material | prepreg |
| 6700 | Bondingfilm preparation | prepreg |
| 6900 | Routing_preparation | prepreg |
| 6000 | Material | backing |
| 7700 | CU Etch_1 | backing |
| 8800 | Routing 4-Slots | backing |
| 6900 | Routing_preparation | backing |
| 6600 | Multibond | backing |
| 6700 | ML pressing | total construction |
| 6900 | Depth drilling_1 | total construction |
| 8800 | Depth routing_2 | total construction |
| 7000 | Plasma Etch | total construction |
| 7075 | Black_Hole | total construction |
| 7200 | Lamination_Outerlayers | total construction |
| 7300 | Exposure outerlayers | total construction |
| 7400 | control_1 | total construction |
| 7500 | Plating_Cu + PbSn | total construction |
| 7700 | Kooper Etch_1 | total construction |
| 7800 | PbSn_strip | total construction |
| 6900 | Depth drilling_1 | total construction |
| 8800 | Depth routing | total construction |
| 6900 | Drilling | total construction |
| 7400 | 100% visual inspection | total construction |
| 8550 | Chem_Ni/Au | total construction |
| 8100 | Via's Plugging | total construction |
| 8200 | Soldmask_Coaten2 DP 2500 | total construction |
| 8500 | Component identification | total construction |
| 6900 | Routing preparation | total construction |
| 8800 | Post treatment routing | total construction |
| 8700 | Bare board testing | total construction |
| 8900 | Final inspection | total construction |

INTEGRATED CIRCUIT HEAT SINK DEVICE INCLUDING THROUGH HOLE TO FACILITATE COMMUNICATION

FIELD OF THE INVENTION

This present invention relates to electronic circuit devices and, more particularly, to an apparatus and method of manufacturing through-holes, which are used, for example, in connecting power transistors on printed circuit boards, in semiconductors, and the like.

BACKGROUND OF THE INVENTION

In assembling components for electronic devices, integrated circuit chips are mounted on multi-layer boards and cards which are then incorporated into a final product. It is known in the art to attach an integrated circuit chip, or power transistor, to a chip carrier that is then mounted on and secured to a multi-layer circuit board. Usually the chip is soldered to the chip carrier using various known methods such as wave soldering. The chip carrier usually includes pins extending from the surface that is opposite the side where the chip is attached. These pins extend into through-holes formed in the circuit board.

Increasingly, more and more devices are incorporated on a single chip, increasing the number of input and output channels (I/O's) associated with a chip. Thousands of devices have been incorporated into a single chip. As the number of I/O's increase, the number of connections between the integrated circuit and the circuit board and the number of through-holes which must be formed in the circuit board increases. Consequently, to reduce the amount of material that must be taken away from the circuit board to form a through-hole, and to greatly increase the I/O density, it is common to use direct chip methods to mount a chip directly on a printed circuit board.

With direct chip attachment methods, a chip is directly mounted on a circuit board using solder balls to connect the chip I/O's to the through-holes in the multi-layer board. Such balls have a much smaller diameter than the pins associated with the chip carriers allowing the removal of less material from the board and the closer spacing of the through-holes. Direct chip attachment methods usually involve placing a solder ball directly over the through-holes in the board, then placing the board or chip on top of the balls so that the location of the balls corresponds to I/O's on the chip, and finally soldering the assembly together.

Such multi-layer printed circuit boards used in the above application generally include a plurality of power and signal layers separated by insulating layers. The power, signal and insulating layers are laminated together in one structure making the board. The through-holes in the board for attaching chips, power transistors and the like, are often drilled either mechanically or with a laser all the way through the individual layers before the board is laminated. The manufacturing technique involves drilling all the way through each layer and then repeating this step with the other layers before lamination occurs. Additional preparation of each through-hole is required, before lamination of the layers occur. The result is a solidly laminated printed circuit board. As the number of I/O's associated with a chip increases, the density of the through-holes increases. Consequently, because of the increased number of through-holes manufacturing is time consuming and expensive.

In one invention that avoids the problems associated with a high density of through-holes in the circuit board, multi-layer boards have been fabricated using cores. A plurality of cores that typically consist of a power plane, upper and lower signal layers, and plated through-holes extending through the thickness of the core, are first fabricated. A circuit board is formed by joining two or more cores together. In this method it is essential that the electrical connections be properly achieved between the vertically aligned plated through-holes and adjacent cores. This is difficult to achieve and elaborate jigs must be created to set up the circuit board.

Proper electrical connections joining cores have been achieved by applying an upper and lower cap to each core. The caps consist of a layer of conductive material. The electrically conductive material is then joined to a layer of electrically insulating material. Each cap includes via holes extending completely through the thickness of the insulating layer. These via holes are formed in the insulating layer at points corresponding to the plated through holes in the cores, so that when the cap is placed adjacent to the core the vias and the plated through-holes will be aligned. After the formation of the vias in the electrically insulating layer of the cap, electrically conductive material is deposited into each via hole using conventional electroplating techniques. However, this method requires numerous and costly steps in providing through-holes in a multi-layer heavy density printed circuit board.

There is yet another method of manufacturing a printed circuit board whereby through-holes are first formed, by photolithography, in a base plate having two main surfaces and electrically insulating, transparent and photosensitive properties. The through-holes extend from one of the main surfaces to the other, with a cross-sectional area thereof decreasing from opposite ends to an intermediate position. Conductive layers are formed to fill the through-holes and extend over the main surfaces of the base plate. Then the conductive layers formed on one of the main surfaces of the base plate are removed. Portions of the base plate are then removed from one of the main surfaces so that the conductive layers filling the through-holes project from one of the main surfaces of the base plate. This method requires through-holes in each surface to be individually formed prior to the different surfaces bonding to each other. This method of manufacturing is time consuming and costly because of the photolithography process.

In yet another invention there is a process for making an assembly of a semiconductor device that includes a hole forming step that forms a plurality of through-holes in a reinforced insulator plate. The plate has a first side pad electrode layer, a semiconductor layer having a first side semiconductor surface facing toward the first side pad electrode layer, and a second side semiconductor surface opposite to the first side semiconductor surface. Each of the through-holes extends from the first side plate surface of the reinforcing plate to a second side plate surface of the reinforcing plate.

The process further comprises a second side conductive layer forming step of forming a second side conductive layer on the second side plate surface of the reinforcing plate. Next there is a first side conductive layer preparing step of forming a second side conductive layer on the first side plate surface of the reinforcing plate.

As this method proceeds, it includes a first connecting step of connecting the first and second side conductive layers by filling a first conductive bonding material, in the through-holes, and joining the semiconductor piece and reinforcing plate by forming a layer of the first conductive bonding material between the first side electrode layer and the second side conductive layer. The next step is a grinding of the semiconductor piece mounted on the reinforced plate from the second side semiconductor surface to form a ground semiconductor surface. The reinforcing plate having through-holes for electrical connections enables the grinding and eventual bonding of the semiconductor piece to the reinforcing plate. However, this method of manufacturing is both time consuming with many manufacturing steps and therefore is costly.

In the manufacture of integrated circuit boards, the chip package designer attempts to obtain ever greater wiring densities while, at the same time, forming interconnections between adjacent layers that provide reliable circuits with as little inductance and resistance as possible. As a consequence, the through-holes that are used for interconnections are produce high quality interconnections.

It is known to use lasers to form vias in multi-layer boards. There is a process for manufacturing a multi-layer hybrid for a multi-chip module (MCM) device that uses a metallic conductive pattern layer formed on an inorganic insulating layer. Vias having a diameter of between 25–125 μm are formed by laser drilling through an inorganic insulating layer for making electrical connections between conductive pattern layers. Again, this method is time consuming and costly to produce.

There is still another method for producing a low inductance via in a laminated substrate. A first dielectric layer is formed on a first conductive layer, and a second conductive layer is formed on the first dielectric layer. A first conductive path is formed in the first conductive layer that extends along a first route between a first node and an second node. A first blind via is formed in the first dielectric layer at the second node and is then connected to the first conductive path. A second conductive path is formed in the second conductive layer connected to the first blind via. The second conductive path extends between a third node and the first blind via along a second route that corresponds identically to at least a portion of the first route. A mutual inductance formed by the first conductive path with the second conductive path cancels a mutual inductance formed by the second conductive path with the first conductive path. Furthermore, buried vias are formed in the dielectric layers. Although, a plurality of low inductance vias can be formed by arranging the blind-vias and buried vias into rows and columns, this manufacturing method is time consuming and costly. It is costly because a laser individually drills the vias in each layer prior to lamination of the layers. Once lamination occurs, then the vias need to be cleaned out because of excess material that forms in the vias at the lamination interfaces.

What is needed for a printed circuit board assembly is a method of manufacturing such an assembly that will have small through-hole diameters and high through-hole aspect ratios yet save manufacturing time, material and cost over the prior art.

SUMMARY OF THE INVENTION

It is an aspect of the present invention to provide a method of manufacturing through-hole connections from the top side of the printed circuit board to the backing that is cost effective.

It is another aspect of the present to provide a method of manufacturing through-hole connections that can be applied to full metal backing or partial metal backing printed circuit boards.

It is yet another aspect of this invention to provide a method of manufacturing through-hole connections optimizing the heat dissipation of the printed circuit board backing.

These and other aspects are apparent in a method of manufacturing a printed circuit board through-hole connection includes forming a through-hole by removing material from the first side of the printed circuit board until the backing and then slightly into the first side of the backing providing a hole. Next, plating through the hole connecting the backing layer, ground layer, and signal layer. Now the plating of the signal layer is removed without removing the connection from the ground layer to the backing. Finally, the hole is filled from the first side of the printed circuit board.

A method of manufacturing a MMIC printed circuit board through-hole connection includes forming a through-hole by removing material from the first side of the MMIC printed circuit board through the first signal layer, through the MMIC until the second signal layer, and then slightly into the top side of the second signal layer. Once the material is removed, an electrical connection is provided to the first signal layer, the MMIC and the second signal layer.

A printed circuit board through-hole connection that includes an assembled layout of a printed circuit board and formed through holes by material removed from the first side of the printed circuit board up to the backing and then slightly into the top portion of the backing. It further includes plated through-holes that connect the backing, a ground layer and a signal layer, removed plating from the signal layer without the connection removed from the ground layer to the backing and filled through-holes from the first side with a non conductive filler.

These and other aspects of this invention will become apparent from the following description, the description being used to illustrate a preferred embodiment of the invention when read in conjunction with the accompanying drawings.

DETAILED DESCRIPTION OF THE INVENTION

While the present invention is described below with reference to a printed circuits board, a practitioner in the art will recognize the principles of the present invention are applicable elsewhere.

Figures 1, 2:
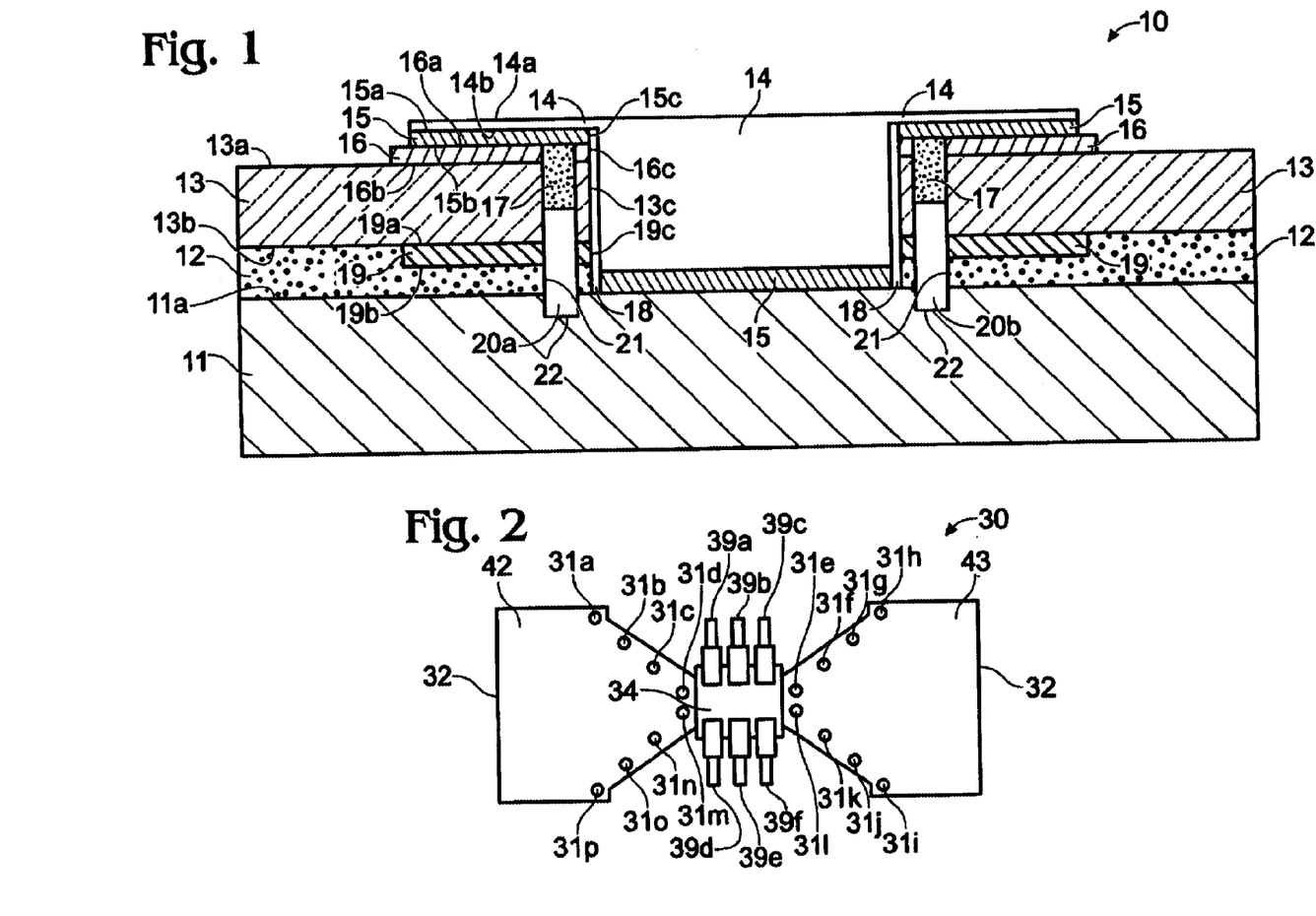
FIG. 1 shows a cross section view of nonconductive bonding material with the preferred embodiment of the invention.
FIG. 2 shows a directed top view of a partial heat sink with the preferred embodiment of the invention.
Figure 3:
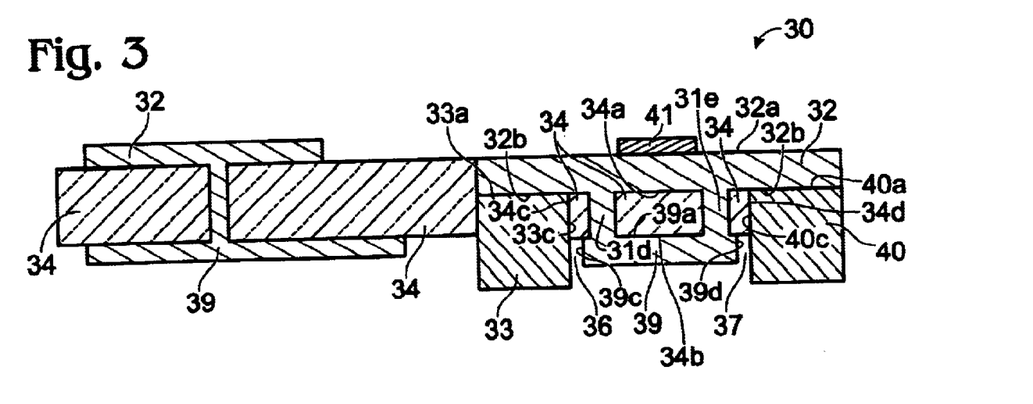
FIG. 3 shows a cross section view of a partial heat sink with the preferred embodiment of the invention.

As shown in FIGS. 1 through 3, the apparatus and method of the invention comprises depth-drilling through-holes on an assembly, or "lay-up", of the constituent laminar elements of the printed circuit board ("PCB"), then making connections from the PCB to the backing by using plated through-holes that are back-filled. The method is generally applied on full metal backing or partial metal backing. The full metal backing is typically a homogenous copper that is highly conductive and very effective at heat dissipation. Whereas, the partial metal backing is typically a copper foil that is conductive and laminated to a non conductive material such as fiberglass or a ceramic.

FIG. 1 shows the preferred embodiment of the invention in a cross section build-up of nonconductive bonding material. The assembled lay-up 10 printed circuit board includes a high power transistor 14 that is positioned on top of a heat sink backing 11 and connected by means of solder 15. The backing 11 is then typically mounted on a pallet. The heat sink backing 11 is any conductive material that includes, but is not limited to, copper, brass, or aluminum. A gap 18 is present around the transistor 14 and the nonconductive bonding material 12, the dielectric 13, ground layer 19, signal layer 16 and solder 15. The filler 17 contacts the signal layer 16, void 18, dielectric 13, solder 16 and plating 21. The solder 16 is formed by either low temperature or high temperature soldering as required by the design.

In the preferred embodiment of the invention, the dielectric 13, or insulate material is fiberglass. However, depending on the application, other porous material, for example, Kevlar, carbon fiber, or Teflon-coated polymer fibers are also used to particular effects. The preferred filler 17 are thermosetting resins that include, but are not limited to, polyimide resin, epichloridehydrin bisphenol-A resin (epoxy), or bismaleimidetriazine ("BT") resin, and other heat-curing resins may also be used advantageously. Also, additional resins are included in the basic resin to impart special electrical or mechanical properties. For example, such additives include polyphenylene oxide ("PPO"), polyphenylene stearate ("PPS"), and polyether imide.

The dielectric material 13, for example, fiberglass, is impregnated with a thermosetting epoxy resin to form a matrix that is a relatively soft malleable solid. The dielectric 13 is made by soaking a dry sheet of dielectric material 13 with a coating of uncured resin, draining off the excess resin, then flash-drying otherwise removing the solvent. The remaining resin on the dielectric 13 is then partially cured by the application of heat into a malleable solid. Alternately, a variety of composites of porous dielectrics 13 impregnated with relatively soft resin are available commercially from a number of suppliers for use in ordinary PCB fabrication. Finally, the dielectric 13 is prepared by forming a dielectric opening 15c that is large enough to allow the positioning of a power transistor 14 with a gap 18. The size of the dielectric opening 13c is dependent upon the size of the power transistor 14 and design requirements for the size of the gap 18. The top surface 13a of dielectric 13 is bonded to the bottom surface 16b of signal layer 16. The bottom surface 13b of dielectric 13 is bonded with non conducting bonding material 12.

The heat sink backing 11 is simply a slab or coupon of material that is an effective conductor of heat. The backing is either full metal or partial metal. The partial metal backing, as understood by a practitioner in the art, is a variety of metal covered substrates wherein the substrate, for example, is fiberglass covered by highly pure copper foil. The full metal backing 11, in the preferred embodiment of the invention, is 99.999% pure copper. The high power transistor is mounted to the top side 11a of heat sink backing 11 by solder 15. The solder 15 does not touch the non conductive bonding material 12 and there is a void 18 between the solder 15 and the non conductive bonding material 12. The top side 11a of the heat sink backing 11 is bonded with the non conductive bonding material. The thickness of the heat sink backing 11 varies, and depends on the amount of heat that is required to be dissipated in each application. The heat sink backing 11 is typically copper or brass, but as is any material that is effective in conducting heat.

In the preferred embodiment of the invention, the heat sink backing 11 is made of pure soft copper. The top surface 11a of the copper backing 11 has been chemically oxidized to make it easier to bond to. Copper provides a good tradeoff among thermal conductivity, bondability (whether to epoxy or solder), and lower cost. Obviously, precious metals such as silver or gold provide greater thermal conductivity relative to copper for backing 11, but their costs are high. Other low-cost heat sink backing 11 materials include aluminum alloys, a beryllium-copper alloy, and brass.

Another material that is used for the heat sink backing 11 is aluminum, because of its low cost and high thermal conductivity. However, unlike copper, aluminum is difficult to plate with other metals and/or solder to because it has a tendency to oxidize rapidly in ordinary ambient conditions. Furthermore, aluminum has a higher coefficient of thermal expansion and lower structural integrity than many other materials, including silicon. Therefore, extra care is required in the design of PCB's using aluminum and its alloys to avoid cracking and/or warping over wide temperature ranges.

The ground layer 19 is positioned between the dielectric 13 and backing 11 within the non conductive bonding material 12. The top portion 19a of the ground layer 19 communicates directly with the bottom portion 13b of the dielectric 13. The bottom portion 19b communicates directly with the non conductive bonding material. There is a gap 18 between the side of the high power transistor 14 and edge 19c of the ground layer 19. The ground layer edge 19c is manufactured by methods known by the practitioner in the art, and is sized depending on the application and electronic module, for example, a transistor 14, to be positioned within the ground layer edge 19c. The ground layer 19 is any conductive material, for example, copper, but is also aluminum, brass or other conductive alloys. The material used depends on the application and cost consideration for each design.

Now looking at the signal layer 16, the material used in the preferred embodiment of the invention is copper. However, aluminum, brass, or other conductive metals or alloys are useable for the signal layer 16 depending on the design requirements. The bottom portion 16b of the signal layer communicates with the top portion 13a of the dielectric 13. The top portion 16a of the signal layer 16 is exposed for an electronic module, for example, a high power transistor 14 to be positioned in the lay-up 10. A solder 15 is used to connect the transistor 14 to the top side 16a of the signal layer 16. Also, there is a gap 18 between the side of the high power transistor 14 and edge 16c of the signal layer 16. The signal layer edge 16c is manufactured by methods known by the practitioner in the art, and is sized depending on the application and electronic module, for example, a transistor 14, to be positioned within the signal layer edge 16c.

Prior to assembly of the high power transistor 14 on lay-up 10, an assembled lay-up 10 printed circuit board is provided to form a through-hole. The through hole 20a is formed by removing material from the first side of the printed circuit board, which is the signal layer top portion 16a, completely through the dielectric 13 and non conductive bonding material 12, until the heat sink backing 11. The backing 11 material is removed only slightly into the top portion 11a of the backing 11. The through-hole provided is formed by depth drilling the through-hole 20a until location 22. The amount of material removed in the backing 11 by depth drilling depends upon the design and application. The use of different materials in the backing 11 partially directs the amount of depth drilling into the top portion 11a of the backing 11. Another through-hole 20b is shown in FIG. 1. However, as is understood by the practitioner of the art, each PCB is different with numerous and a variety of through-holes located in any lay-up 10. There are a plurality of through-holes depending on the application and design.

After the through-hole 20a is formed, the edge 21 of the through-hole is plated through connecting the backing, ground layer and signal layer. Chrome has been found useful for plating, the through-hole edge 21, due to its high strength which is useful in subsequent bonding steps. However, those skilled in the art will recognize a plurality of other conductive metals, metallic compounds, or alloys are useable for the plating, including but not limited to, copper, aluminum, silver, gold, aluminum alloys, or beryllium-copper alloy. Conventional deposition and masking techniques are used to achieve the desired metal coating. Additional material layers are used where desired to assure adequate electrical connection and mechanical strength of the plating layer.

The next step after plating the through-hole 20a is to remove the plating from the signal layer 16, edge 16c, without removing the plating connection from the ground layer 19, edge 19c. The plating is removed to a location, dependent on the design, from the dielectric 13, edge 13c. Plating is removed by depth drilling to the desired location in the dielectric 13 through the signal layer 16. Once the desired plating is removed the through hole 20a is filled with a non conductive filler 17 from the first side of the printed circuit board, which in the preferred embodiment of the invention is the top portion 16a of the signal layer 16, to the desired location in the dielectric 13. Alternately, the filler 17 occupies all of the through-hole 20a. Finally, transistor 14 is mounted to the top portion 16a of the signal layer 16 and connected by solder 16. Furthermore, as is understood by the practitioner in the art, transistor 14, mounted on printed circuit board lay-out 10, is substitutable by a plurality of other electronic modules including, but not limited to, diodes, rectifiers, and semiconductors, as required in other applications.

The depth drilling is accomplished through various methods including, but not limited to, mechanical drilling, constant laser drilling, or pulse laser drilling. For example, in one application, through-hole 20a is formed by laser drilling through the signal layer 16, through the dielectric 13 and slightly into the backing 11 by using a plurality of laser pulses that are applied at desired locations of through-holes. Each laser pulse applied has an energy density per pulse that is greater than the ablation threshold of material that is being depth drilled. If needed, once the through-hole 20a has been depth drilled, a post pulse processing technique, as known by the practitioner in the art, is used for enhancing the through-hole 20a. Laser drilling is accomplished with a laser source and optics system that directs a focused beam of energy onto lay-up 10. The lay-up 10 is positioned on an X-Y positioning table. Although, in the preferred embodiment of the invention the through-hole 20a that is formed is a circular shape, a plurality of through-hole shapes are formed, using the X-Y positioning table, including but not limited to, oval, square, or the like. Mechanical drilling includes, but is not limited to, rotary bit, and the like.

In FIG. 2, a directed top view is shown of an assembled lay-up 30 of a MMIC printed circuit board which is a partial heat sink and monolithic microwave integrated circuit (MMIC). The MMIC 34 is positioned between a first signal layer 32 and a second signal layer 39 that contains connectors 39a, 39b, 39c, 39d, 39e, and 39f. In this embodiment of the invention the signal layers are copper, but as is understood by the practitioner in the art the signal layer material is a plurality of conductive metals and/or metal alloys. On the first side 42 of the first signal layer 32 are through-holes 31a, 31b, 31c, 31d, 31m, 31n, 31n and 31o. On the second side 43 of the first signal layer 32 are through-holes 31e, 31f, 31g, 31h, 31I, 31j, 31k and 31l.

An assembled lay-out 30 of a MMIC printed circuit board is provided to form through-holes. The through holes are depth drilled removing material from the first side of the MMIC printed circuit board, which in the preferred embodiment of the invention, is through the first signal layer 32, through the MMIC 34, until the second signal layer 39 and then slightly into the top portion of the second signal layer 39, providing the through-holes. Typically, depth-drilling is accomplished by mechanical drilling, constant laser drilling, or pulse laser drilling. The through-holes are then plated connecting the first signal layer 32, the MMIC 34 and the second signal layer 39. The plating consists of using a conductive coating that includes, but is not limited to, copper, chrome, aluminum or alloys. Finally, the plated through-hole is filled with a non conductive material which is preferably an epoxy including, but not limited to, polyimide resin, epichloridehydrin bisphenol-A resin (epoxy), or bismaleimidetriazine ("BT") resin, and other heat-curing resins may also be used advantageously. Alternately, after the through-hole is depth drilled it is filled with a conductive filler which is selected from a variety of conductive fillers that electrically connects the first signal layer 32, the MMIC 34 and the second signal layer 39. The conductive fillers include, but are not limited to, cooper, brass, aluminum, silver, gold, copper alloys, and the like. Consequently, plating of the through-hole is not required for a connection between the first signal layer 32, MMIC 34 and the second signal layer 39 when electrically conductive filler is used in the through-hole.

FIG. 3 is an expanded cross section of the directed top view in FIG. 2 showing an assembled lay-up 30 of a MMIC printed circuit board, which is a partial heat sink and monolithic microwave integrated circuit (MMIC). The MMIC 34 is positioned between a first signal layer 32 and a second signal layer 39 that shows through-hole 31d and through-hole 31e. The first heat sink backing 33 and the second heat sink backing 40 communicate with the bottom portion of the first signal lay 32. The bottom portion 32b of the first signal layer 32 is bonded to the top portion 33a of the first heat sink backing 33. An upper portion 33c of the heat sink backing 33 communicates with the first edge 34c of the MMIC 34. The bottom portion 32b of the first signal layer 32 is bonded to the top portion 40a of the second heat sink backing 40. An upper portion 40c of the second heat sink backing 40 communicates with the second edge 34d of the MMIC 34. The top portion 34a of the MMIC 34 is bonded to the bottom portion 32b of the first signal layer 32. Also, the bottom portion 34b of the MMIC is bonded to the top portion 39a of the second signal layer 39. The first edge 39c of the second signal layer 39 is separated by a first gap 36 from the edge 33c of the first heat sink backing 33. The second edge 39d of the second signal layer 39 is separated by a second gap 37 from the edge 40c of the second heat sink backing 40.

An assembled lay-out 30 of a MMIC printed circuit board is provided to form through-holes. The through-hole 31d and through-hole 31e are depth drilled removing material from the top portion of the MMIC printed circuit board, which in the preferred embodiment of the invention is through the top portion 32a of the first signal layer 32, through the MMIC 34, until the second signal layer 39, and then slightly into the top portion 39a of the second signal layer 39, providing the through holes. Typically, depth-drilling is accomplished by mechanical drilling, constant laser drilling, or pulse laser drilling. The through holes are then plated electrically connecting the first signal layer 32, the MMIC 34 and the second signal layer 39. The plating consists of using a conductive coating that includes, but is not limited to, copper, chrome, aluminum or alloys. Finally, the plated through-hole is filled with a non conductive material which is preferably an epoxy including, but not limited to, polyimide resin, epichloridehydrin bisphenol-A resin (epoxy), or bismaleimidetriazine ("BT") resin, and other heat-curing resins may also be used advantageously. Alternately, after the through-hole is depth drilled it is filled with an electrically conductive filler which is selected from a variety of conductive fillers that electrically connects the first signal layer 32, the MMIC 34 and the second signal layer 39. The conductive fillers include, but are not limited to, copper, brass, aluminum, silver, gold, copper alloys, and the like. Consequently, plating of the through-hole is not required for a connection between the first signal layer 32, MMIC 34 and the second signal layer 39 when electrically conductive filler is used in the through-hole.

Figure 4:
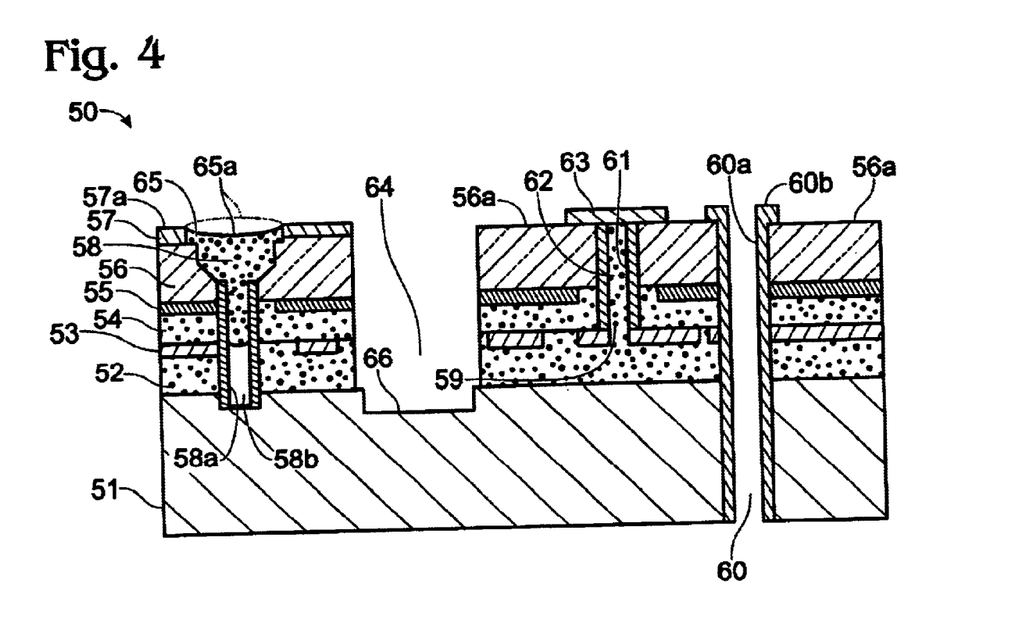
FIG. 4 shows a cross-section view of a smartbacking buildup with the preferred embodiment of the invention.

In FIG. 4, a cross-section view 50 is shown of smartbacking build-up, with the preferred embodiment of the invention, in a circuit board. This view 50 is an implementation wherein heat is removed without sacrificing the integrity of required impedance of the circuit. The ground layer backing 51 or seventh layer is typically composed of a copper material, electronic grade, 0.5 hardened, or may be any conductive material such as aluminum, beryllium-copper, metal alloys, brass, and the like. The backing 51 is typically about 1.5 mm thick, but its thickness varies and is a plurality of sizes depending on the design requirements. The backing 51 is a heat sink that allows the heat generated in the circuit board to be removed as necessary. A sixth layer 52 is bonded to the seventh layer backing 51. The sixth layer 52 is typically a non-conductive material like epoxy, but as is understood by the practitioner in the art, the non-conductive material is a variety selected for their adhesion and cure characteristics. Typically, the sixth layer is about 0.13 mm thick, but varies depending on the design and application. This non conductive material is used for the fourth layer 54, wherein a logic layer 53, that is optional and required only if connections are not possible on the first layer 57, is sandwiched between the sixth layer 52 and fourth layer 54. The fourth layer 54 is typically about 0.13 mm thick and varies with design. The logic layer 53 is typically about 0.50 ounce copper foil, but is also any material that is highly conductive such as aluminum, and the like, and is a variety of weights depending on the application. A copper laminate layer, the third layer 55, that is typically about 0.35 mm thick, is positioned between the fourth layer 54 and the second layer 56 a dielectric. For example, Teflon (PTFE) with a thickness of 1.27 mm, is used as the dielectric 56 material, but the material varies as required by the design and application. Finally, the first layer 57 is a conductive material, such as a copper laminate, or nickel, gold, and the like, and where the connections of the circuit board occur, is typically about 0.35 mm thick.

The depth drilling forms a first through-hole 58, a blind-hole 59 and a second through-hole 60. At the first through-hole 58 and first access hole 58b, depth-drilling is either mechanical, constant laser or pulse laser. The material from the first side 57a of the first layer 57 through the second layer 56, the third layer 55, the fourth layer 54, the fifth layer 53, the sixth layer 52 and slightly into the seventh layer 51, is removed forming the first through-hole 58 and first access hole 58b. The first through-hole 58 drilling diameter is about 0.90 mm with a finish size of 0.80 mm, and a first access hole 58b drilling diameter of about 0.60 mm with a finish diameter as required by the design parameters of the circuit board. Thus, depth drilling can be used to form through-holes with a variable diameter within the same location of the through-hole. After the first access hole 58b is formed, the edge 58a of the access hole 58b is plated through connecting the backing layer 51, the sixth layer 52, the logic layer 53, the fourth layer 54, the third layer 55 and the dielectric layer 56. Chrome has been found useful for plating, the first edge 58a of the access hole 58b, due to its high strength which is useful in subsequent bond steps. However, as a practitioner in the art understands, copper plating, electroless nickel plating or immersion gold plating is substitutable for chrome. In another application electroless nickel is plated in the range of about 3 um–6 um and immersion gold is plated in the range of about 0.05 um–0.1 um. Once the plating step is completed, the first filler 65 is added. The top side 65a of the first filler 65 is shaped either as concave or convex depending on the application. The first filler 65 material is an epoxy including, but not limited to polyimide resin, epichloridehydrin bisphenol-A resin, or bismaleimidetriazine resin, and other heat-curing resins as desired. The through-hole 58 is completely filed with the first filler 65, and the access hole 58b is partially filed with the first filer 65. The access hole is sometimes completely filed with the first filler 65, but typically the filler extends into the access hole 58b to about the fifth layer 53.

The depth drilling forms a blind hole 59. The depth drilling is performed by mechanical means, constant laser means or pulsating laser means. The blind hole 59 is formed by removing material from the first side 56a of the dielectric 56 through the dielectric 56, the fourth layer 54, the fifth layer 53 and partially into the sixth layer 52. Once the depth drilling is complete, a second edge 61 is plated using chrome, copper, nickel or gold, and the like, to form an electrically conductive path from the dielectric 56 to the fifth layer 53. The blind-hole 59 is completely filed with a second filler 62, and soldered 63, with a conductive material, that forms an electrically conductive path from the solder 63, to the plated second edge 61, capping the blind hole 59 closed.

The depth drilling forms the second through hole 60 where the second through-hole 60 is drilled from the first side 56a of the dielectric, through all the layers to the backing 51, and completely through the backing 51. The third edge 60a is plated with a top portion 60b of the third edge 60a being plated on the first side 56a of the dielectric 56. An electrically conductive path is formed at the third edge 60a and top portion 60b from the first side 56a of dielectric 56, through all the layers to the backing 51 and completely through the backing 51.

Figure 5:
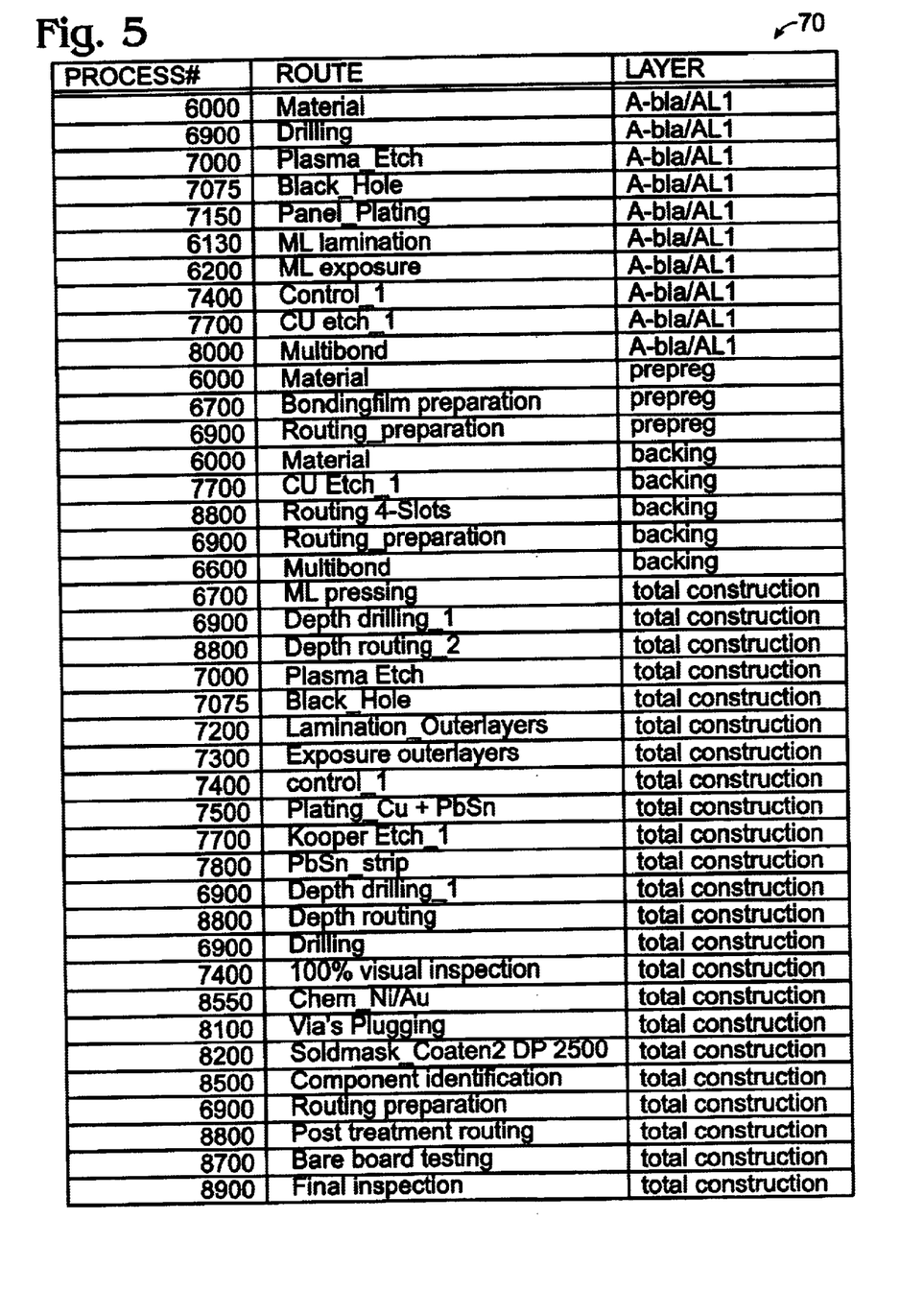
FIG. 5 shows a flow process of the manufacturing steps of the preferred embodiment of the invention for smartbacking build-up.

In FIG. 5, flow process 70 shows the manufacturing steps of the preferred embodiment of the invention for smartbacking build-up. The flow process 70 is a 41 step manufacturing process that takes material such as the backing 51 and third layer 55, as shown in FIG. 4, and proceeds to manufacture a circuit board using depth-drilling to manufacture the through-holes.

While there has been illustrated and described what is at present considered to be the preferred embodiment of the present invention, it will be appreciated that numerous changes and modifications are likely to occur to those skilled in the art. It is intended in the appended claims to cover all those changes and modifications that fall within the spirit and scope of the present invention.

What is claimed is:

1. A printed circuit board capable of accepting a heat-generating electronic component, comprising:
   a) a substrate having a signal layer on at least a portion of a first surface of said substrate;
   b) a metal ground layer adjacent at least a portion of a second surface of said substrate;
   c) a heat sink layer;
   d) a bonding layer for affixing said heat sink layer to said metal ground layer and, where said metal ground layer is not coextensive with said substrate, for affixing said heat sink layer to said second surface of said substrate;
   e) a void formed in said substrate, including in said signal layer and in said ground layer, said void sized to accept the heat-generating electronic component;
   f) a through-hole formed in said substrate, including in said signal layer and in said metal ground layer, said through-hole continuing through said bonding layer and at least partially into said heat sink layer;
   g) wherein said through-hole is partially plated with conductive plating to place said heat sink layer and said metal ground layer in electrical and thermal communication and wherein said through-hole is further filled with non-conductive filler to maintain electrical isolation between said metal ground layer and said signal layer.

2. The printed circuit board of claim 1 wherein said bonding layer comprises epoxy.

3. The printed circuit board of claim 1 wherein said heat sink layer is selected from a group consisting of copper, brass and aluminum.

4. The printed circuit board of claim 1 wherein said heat sink layer is coextensive with said substrate.

5. The printed circuit board of claim 1 wherein said heat sink layer is not coextensive with said substrate and is smaller than said substrate.

6. The printed circuit board of claim 1 wherein said through-hole extends completely through said heat sink layer.

7. A printed circuit board heat sink connection comprising:
   a) a multilayer circuit board further comprising:
      i) a substrate having a signal layer formed on a first surface of said substrate;
      ii) a metal ground layer adjacent at least a portion of a second surface of said substrate;
      iii) a heat sink layer; aid
      iv) a bonding layer connecting said heat sink layer to said metal ground layer and, where said metal ground layer is not coextensive with said substrate, connecting said heat sink layer to said second surface of said substrate,
   b) a through-hole formed in said multilayer circuit board;
   c) wherein said through-hole extends through said signal layer, said substrate, said bonding layer and said ground layer and only partially extends through said heat sink layer;
   d) wherein said through-hole is partially filled with conductive filler such that said conductive filler fills that portion of said through-hole adjacent said heat sink layer, said bonding layer, and said metal ground layer;
   e) wherein the portion of said through-hole not filled with conductive filler is filled with non-conductive filler such that said metal ground layer and said signal layer are not in electrical communication.

8. The printed circuit board heat sink connection of claim 7 wherein said heat sink layer is comprised of material selected from the group consisting of copper, brass and aluminum.

9. The printed circuit board heat sink connection of claim 7 wherein said non-conductive filler is selected from the group consisting of polyimide resin, epichloridehydrin bisphenol-A resin and bismaleimidetriazine resin.

10. The printed circuit board heat sink connection of claim 9 wherein said nonconductive filler contains additives selected from the group consisting of polyphenylene, polyphenylene stearate and polyether imide.

11. The printed circuit board heat sink connection of claim 7 wherein said heat sink layer is coextensive with said substrate.

12. The printed circuit board heat sink connection of claim 7 wherein said heat sink layer is not coextensive with and is smaller than said substrate.

13. The printed circuit board heat sink connection of claim 7 wherein said through-hole extends completely through said heat sink layer.

14. An electronic integrated circuit device comprising:
   a) a printed circuit board further comprising:
      i) a substrate having a signal layer on at least a portion of a first surface of said substrate;
      ii) a metal ground layer adjacent at least a portion of a second surface of said substrate;
      iii) a heat sink layer;
      iv) a bonding layer for affixing said heat sink layer to said metal ground layer and, where said ground layer is not co-extensive with said substrate, to said second surface of said substrate;
      v) a void formed in said substrate, including said signal layer, said ground layer and said bonding layer;
      vi) a through-hole formed in said substrate, including said signal layer and said metal ground layer and continuing through said epoxy layer and partially into said heat sink layer,
      vii) which through-hole is partially plated with conductive plating to place said heat sink layer and said ground layer in electrical and thermal communication and which through-hole is further filled with non-conductive filler to electrically isolate said ground layer from said signal layer;
   b) a heat-generating electronic component having a contact surface;
   c) wherein said void is sized to accept said heat-generating electronic component and wherein said component is mounted in said void;
   d) wherein said component's contact surface is connected to said heat sink layer using solder.

15. The electronic integrated circuit device of claim 14 wherein said bonding layer comprises epoxy.

16. The electronic integrated circuit device of claim 14 wherein said conductive plating is selected from the group consisting of copper, silver, chrome, aluminum, gold, beryllium and their alloys.

17. The electronic integrated circuit device of claim 14 wherein said nonconductive filler is selected from the group consisting of polyimide resin, epichloridehydrin bisphenol-A resin and bismaleimidetriazine resin.

18. The printed circuit board heat sink connection of claim 17 wherein said nonconductive filler contains additives selected from the group consisting of polyphenylene, polyphenylene stearate and polyether imide.

19. The electronic integrated circuit device of claim 17 wherein said heat sink layer comprises material selected from the group consisting of copper, brass and aluminum.

20. The electronic integrated circuit device of claim 14 wherein said through-hole extends completely through said heat sink layer.

* * * * *

UNITED STATES PATENT AND TRADEMARK OFFICE
CERTIFICATE OF CORRECTION

PATENT NO. : 6,713,792 B2
DATED : March 30, 2004
INVENTOR(S) : Leendert J. van der Windt It is certified that error appears in the above-identified patent and that said Letters Patent is hereby corrected as shown below:

Column 11,
Line 52, delete "aid" and substitute therefor -- and --.

Signed and Sealed this

Eighth Day of March, 2005

JON W. DUDAS
*Director of the United States Patent and Trademark Office*